United States Patent
Croxford et al.

(10) Patent No.: US 11,809,836 B2
(45) Date of Patent: Nov. 7, 2023

(54) METHOD AND APPARATUS FOR DATA PROCESSING OPERATION

(71) Applicant: Arm Limited, Cambridge (GB)

(72) Inventors: Daren Croxford, Cambridge (GB); Guy Larri, Cambridge (GB)

(73) Assignee: Arm Limited, Cambridge (GB)

(*) Notice: Subject to any disclaimer, the term of this patent is extended or adjusted under 35 U.S.C. 154(b) by 513 days.

(21) Appl. No.: 17/005,046

(22) Filed: Aug. 27, 2020

(65) Prior Publication Data
US 2022/0066739 A1  Mar. 3, 2022

(51) Int. Cl.
| | |
|---|---|
| G06F 7/544 | (2006.01) |
| G06F 16/25 | (2019.01) |
| H03M 7/24 | (2006.01) |
| G06N 3/04 | (2023.01) |
| G06F 18/213 | (2023.01) |

(52) U.S. Cl.
CPC .......... *G06F 7/5443* (2013.01); *G06F 16/258* (2019.01); *G06F 18/213* (2023.01); *G06N 3/04* (2013.01); *H03M 7/24* (2013.01)

(58) Field of Classification Search
CPC ............................... G06F 7/5443; H03M 7/24
See application file for complete search history.

(56) References Cited

U.S. PATENT DOCUMENTS

2017/0139676 A1* 5/2017 Lutz .................... G06F 9/30014

FOREIGN PATENT DOCUMENTS

CN  109801270 A  *  5/2019  ........... G06K 9/4628

OTHER PUBLICATIONS

Lutz et al., "High-Precision Anchored Accumulators for Reproducible Floating-Point Summation", 2017 IEEE 24th Symposium on Computer Arithmetic, Jul. 24, 2017.
Burgess et al., "High-Precision Anchored Accumulators for Reproducible Floating-Point Summation", IEEE Transactions on Computers, vol. 68, 7, Jul. 1, 2019.

* cited by examiner

*Primary Examiner* — Michael D. Yaary
(74) *Attorney, Agent, or Firm* — EIP US LLP; Spencer Gibbs

(57) ABSTRACT

A system includes a fixed-point accumulator for storing numbers in an anchored fixed-point number format, a data interface arranged to receive a plurality of weight values and a plurality of data values represented in a floating-point number format, and logic circuitry. The logic circuitry is configured to: determine an anchor value indicative of a value of a lowest significant bit of the anchored fixed-point number format; convert at least a portion of the plurality of data values to the anchored fixed-point number format; perform MAC operations between the converted at least portion and respective weight values, using fixed-point arithmetic, to generate an accumulation value in the anchored fixed-point number format; and determine an output element of a later of a neural network in dependence on the accumulation value.

20 Claims, 8 Drawing Sheets

METHOD AND APPARATUS FOR DATA PROCESSING OPERATION

BACKGROUND OF THE INVENTION

Field of the Invention

The present disclosure relates to methods and apparatus for performing a data processing operation. The disclosure has particular, but not exclusive, relevance to the performance of a sequence of MAC operations to determine an output element of a layer of a neural network.

Description of the Related Technology

Neural networks have emerged as powerful tools for image processing, inference, machine learning and related tasks. Processing data using a neural network generally involves a large number of multiply-accumulate (MAC) operations. For example, CNN architectures typically include multiple convolutional layers, each of which generates a feature map via convolutions between a data array and one or more kernels. Each feature map contains multiple elements, where each element is computed via a series MAC operations between a subset of elements of the data array and respective weight values of a kernel.

The MAC operations mentioned above account for a large proportion of the computational cost of performing inference or training for a neural network, both in terms of processing time and in terms of power required to switch bits within binary registers. Since MAC operations of the same type are performed repeatedly during inference or training, hardware accelerators have been developed which include arrays of specialized MAC units for this purpose.

SUMMARY

According to a first aspect, there is provided a system perform a sequence of multiply-accumulate (MAC) operations between a plurality of weight values and a plurality of data values of a data array, to determine an output element of a layer of a neural network. The system includes a fixed-point accumulator for storing numbers in an anchored fixed-point number format, a data interface arranged to receive the plurality of weight values and the plurality of data values, wherein the data values are represented in the floating-point number format, and logic circuitry. The logic circuitry is configured to: determine an anchor value indicative of a value of a lowest significant bit of the anchored fixed-point number format; convert at least a portion of the plurality of data values from the floating-point number format to the anchored fixed-point number format; perform MAC operations between the converted at least portion of the data values and respective weight values of the plurality of weight values, using fixed-point arithmetic, to generate an accumulation value in the fixed-point accumulator in the anchored fixed-point number format; and determine the output element in dependence on the accumulation value.

According to a second aspect, there is provided a computer-implemented method of performing a sequence of MAC operations between a plurality of weight value and a plurality of data values of a data array, to determine an output element of a layer of a neural network. The method includes determining an anchor value indicative of a value of a lowest significant bit of an anchored fixed-point number format, receiving the plurality of weight values, receiving the plurality of data values in a floating-point number format, converting at least a portion of the plurality of data values from the floating-point number format to the anchored fixed-point number format; performing MAC operations between the converted at least portion of the plurality of data values and respective weight values of the plurality of weight values, using fixed-point arithmetic, to generate an accumulation value in the anchored fixed-point number form, and determining the output element in dependence on the accumulation value.

A computer program product may be provided comprising machine-readable instructions which, when executed by a computing system, cause the computing system to perform the method described above or any variant described herein. The computer program product may include, for example, a non-transient storage medium comprising the machine-readable instructions.

DETAILED DESCRIPTION OF CERTAIN INVENTIVE EMBODIMENTS

Details of systems and methods according to examples will become apparent from the following description with reference to the figures. In this description, for the purposes of explanation, numerous specific details of certain examples are set forth. Reference in the specification to 'an example' or similar language means that a feature, structure, or characteristic described in connection with the example is included in at least that one example but not necessarily in other examples. It should be further notes that certain examples are described schematically with certain features omitted and/or necessarily simplified for the ease of explanation and understanding of the concepts underlying the examples.

Figure 1:
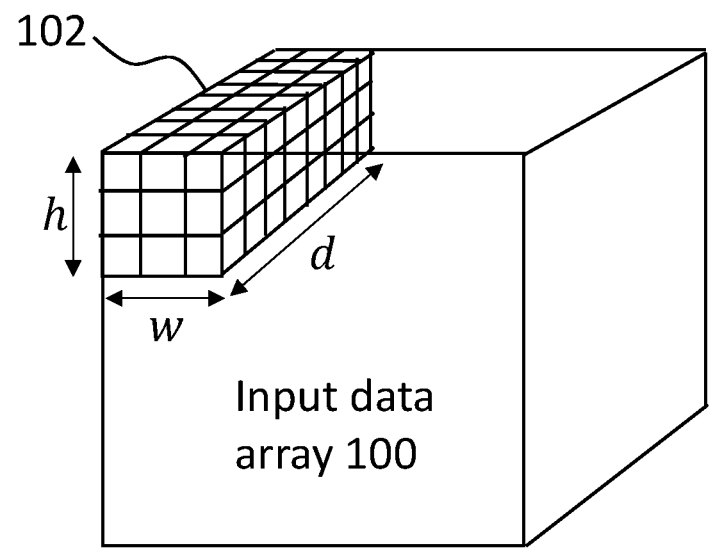
FIG. 1 shows schematically a data processing operation between an input data array and a kernel, to generate an element of an output data array.
Figure 1:
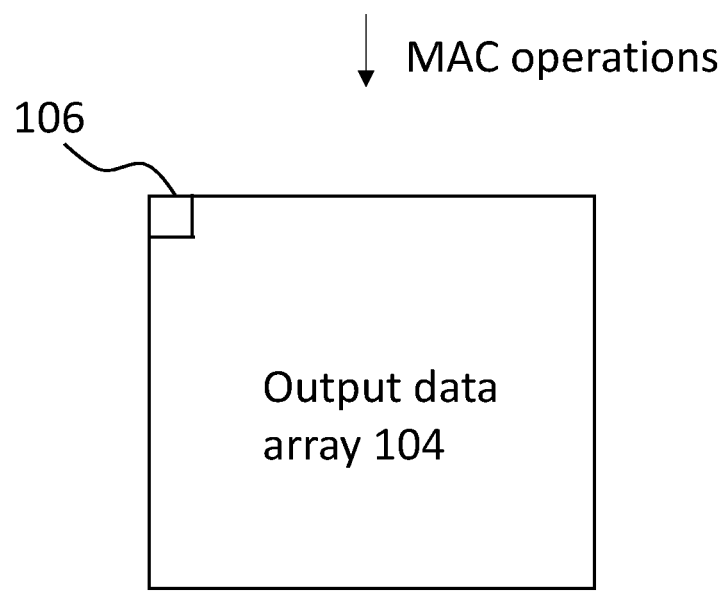

FIG. 1 shows an example of a convolution between an input data array 100 and a kernel 102, which may also be referred to as a filter 102, to generate an output data array 104. In the present example, the input data array 100 is a three-dimensional array with multiple channels each comprising a planar array of numerical data elements referred to hereafter as data values. The number of channels is referred to as the depth of the input data array 100. For example, a color image may be represented by a three-dimensional array with different in-plane positions representing different pixels and with the different planar slices representing different color channels. The kernel 102 is a further three-dimensional array with the same depth as the input data array 100. Elements of the kernel 102 are referred to as weight values. The depth of the input data array 100 and the kernel 102 is d, and the in-plane dimensions of the kernel are w×h. In this example, d=8, w=3, h=3. It will be appreciated that other sizes and shapes of kernel are possible without departing from the scope of the invention. The output data array 104 is a two-dimensional data array.

The convolution is defined such that for a given position of the kernel 102 relative to the input data array 100, multiply-accumulate (MAC) operations are performed in which each weight value of the kernel 102 is multiplied by a coinciding data value of the input data array 100, and the resulting products are summed to generate an element 106 of the output data array 104. For the given position of the kernel 102, a dot product is thereby computed between the kernel 102 and a respective subarray of the input data array 100. To generate the entire output data array 104, this dot product operation is performed for each of a predetermined set of positions of the kernel 102 relative to the input data array 100, where the predetermined positions are separated by a fixed number of elements, referred to as a stride, in each in-plane direction of the array. In the present example, the stride is one in each direction, so that neighboring positions of the kernel 102 relative to the input data array 100 are adjacent to one another. In this example, zero padding is employed such that the input data array 100 is surrounded by a border (not shown) with a width/height of two elements, in which all of the elements are set to zero. This zero padding ensures that the output data array 104 has equal in-plane dimensions to the input data array 100. In other examples, other types of padding may be used. Furthermore, padding may be omitted altogether and/or a stride of greater than one may be used in either in-plane dimension, in which case the output data array 104 would have smaller in-plane dimensions than the input data array 100.

Convolution operations such as that described above are commonly used to generate feature maps within convolutional layers of a convolutional neural network (CNN), either during training of the CNN or during inference once the CNN has been trained. In a given convolutional layer, each planar slice of a three-dimensional output feature map (OFM) is generated by performing a convolution between a three-dimensional input feature map (IFM) and a respective kernel, with different layers of the OFM having different sets of kernels. An OFM may be indicative of a respective set of features that is pertinent for a given task, for example in computer vision or other image processing tasks. Different kernels lead to different sets of features, and although the weight values of a given kernel may be predetermined, for most applications the weight values are learned, possibly with other parameters of the CNN such as a bias, during a training phase. Different sizes of kernel allow for different types of features to be captured. Larger kernels may be capable of capturing more expressive features than smaller kernels, though for many applications, features of interest are highly localized, and are therefore able to be captured using small kernels such as kernels with in-plane dimensions of 3×3. The generated OFM will typically undergo further processing operations, for example application of an activation function and optionally pooling, before being passed to a subsequent layer of the CNN. The processed OFM becomes an IFM for the subsequent layer of the CNN. The subsequent layer may be, for example, another convolutional layer, a deconvolutional layer, or a fully connected layer.

Figure 2:
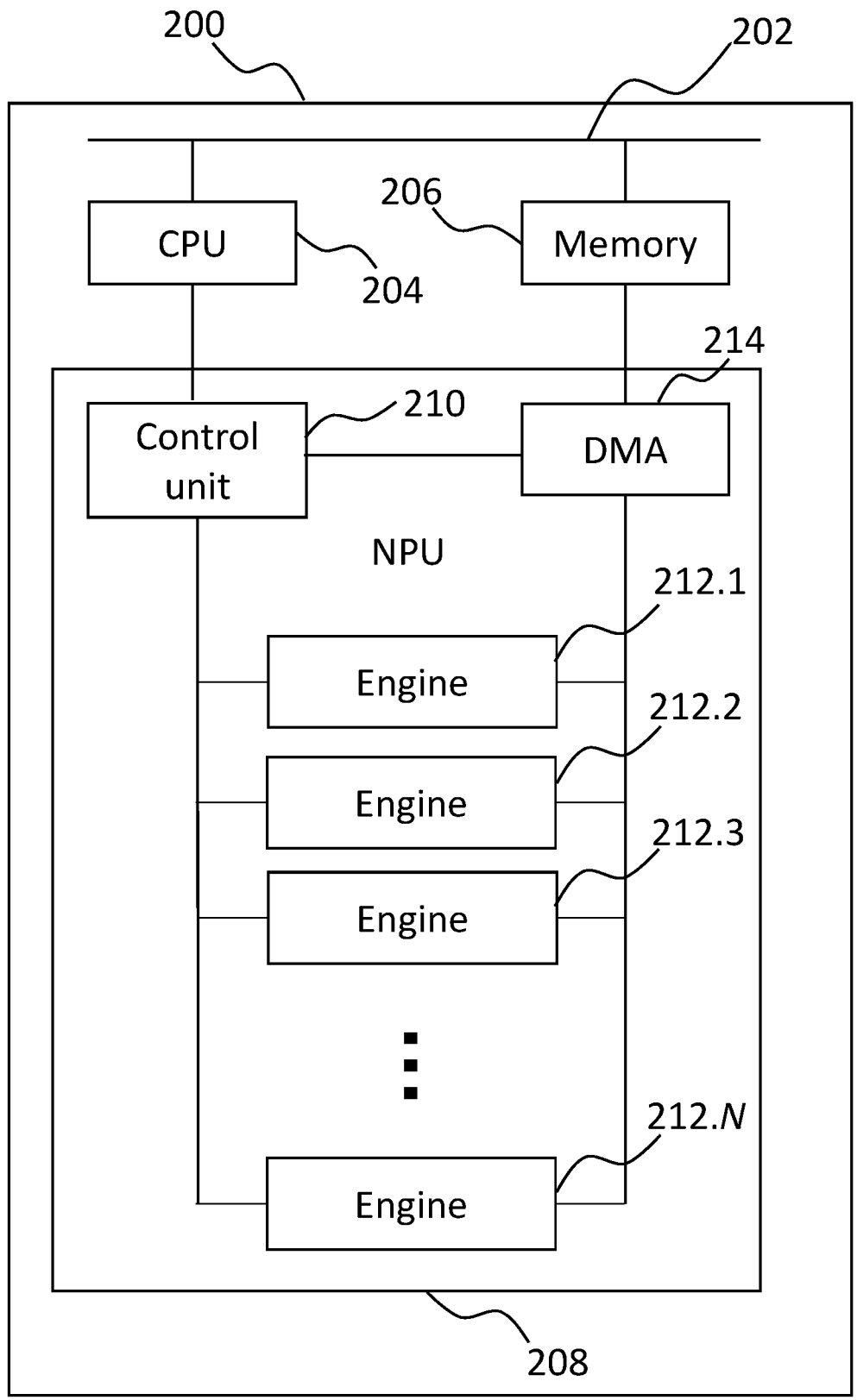
FIG. 2 shows schematically a computing system configured to perform data processing operations in accordance with examples.

FIG. 2 shows an example of a computing system 200 arranged to perform layer processing in accordance with a given neural network architecture The data processing system 200 incudes a system bus 202 connected to a central processing unit (CPU) 204 and memory 206. The memory 206 includes volatile memory including dynamic random-access memory (DRAM) such as synchronous dynamic random-access memory (SDRAM), as well as non-volatile memory and storage, for example flash memory, a solid state drive (SSD) and non-volatile random-access memory (NVRAM). The system bus 202 may also be connected to other components not shown in FIG. 2, for example input/output devices, a graphics processing unit (GPU), network interfaces and the like. The data processing system 200 also includes a neural processing unit (NPU) 208, which is a specialized integrated circuit for processing data in accordance with neural network architectures, for example convolutional neural network (CNN) architectures. An NPU may also be referred to as a neural network accelerator (NNA), a convolutional neural network accelerator (CNNA), a machine learning accelerator, or an artificial intelligence accelerator.

The NPU 208 includes a control unit 210, which includes processing circuitry arranged to generate control data for multiple compute engines 212.1, 212.2, . . . , 212.N, referred to collectively as compute engines 212. In the present example, the NPU 208 includes N=16 compute engines 212, though it will be appreciated that different numbers of compute engines 212 could be employed without departing from the scope of the invention. The NPU 208 is arranged to retrieve data from the memory 206 using a direct memory access (DMA) 214. The data received from the memory 206 can include, for example, image data or IFM data, along with weight data associated with a given neural network layer, and any other parameters such as bias. The NPU 208 is further arranged to write data such as OFM data to the memory 206 using the DMA 214.

Figure 3:
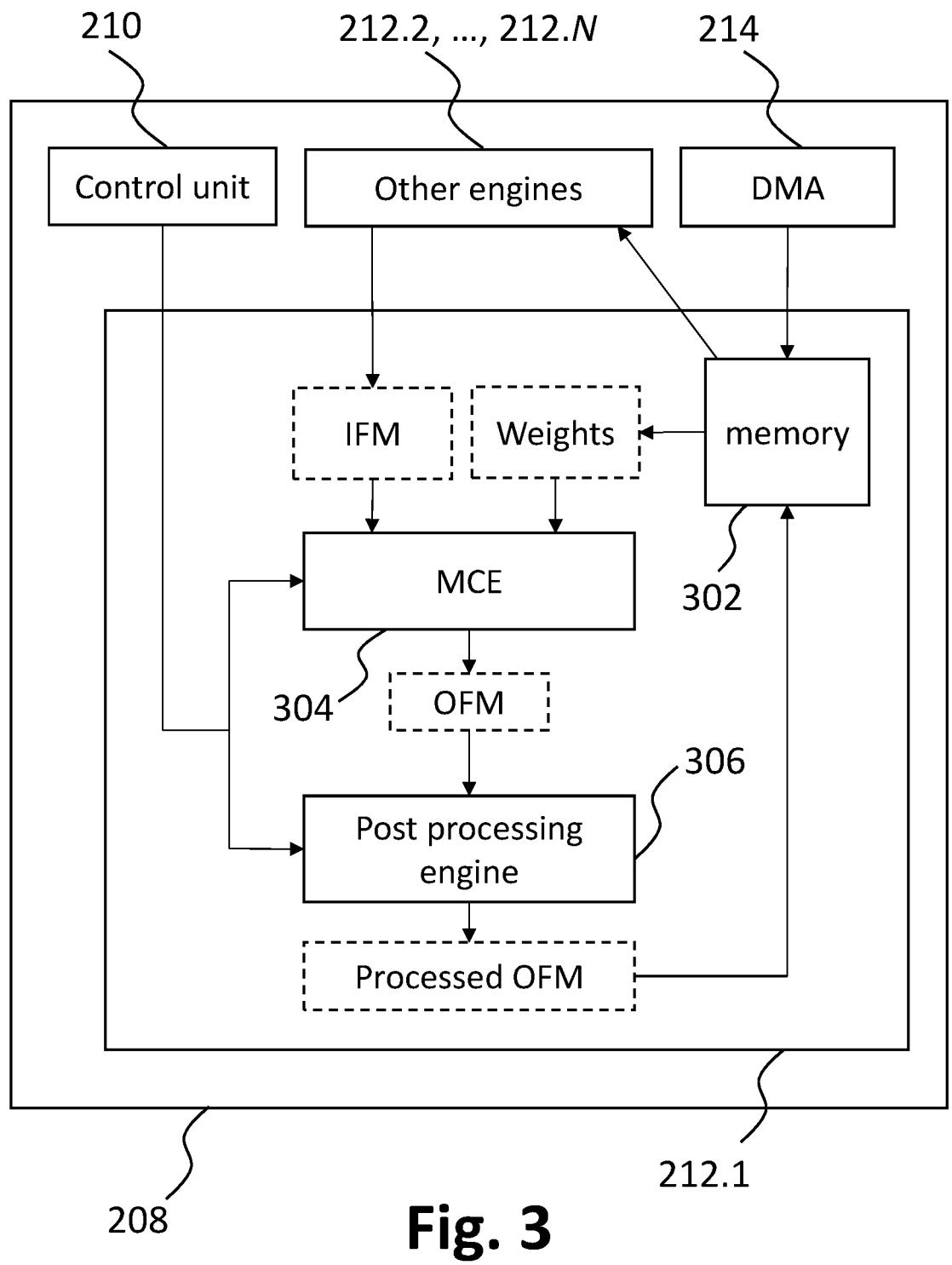
FIG. 3 shows schematically a neural processing unit (NPU) within the computing system of FIG. 2.

FIG. 3 shows the NPU 208 in more detail, including components of the compute engine 212.1. The other compute engines 212.2, . . . , 212.N include substantially the same components as the compute engine 212.1. The compute engine 212.1 includes memory 302, which in this example includes static random-access memory (SRAM). The compute engine 212.1 further includes a MAC computation engine (MCE) 304, which is arranged to process data received from the memory 302 and from analogous memories of the other compute engines 212. The MCE 304 includes components for performing the MAC operations necessary to implement layer processing for a neural network architecture. In particular, the NPU 208 has components arranged for optimized implementation of a convolution (or deconvolution) between an IFM or other data array (such as an image) and a kernel, to generate slices of OFM data as will be described in more detail hereafter.

The compute engine 212.1 further includes a post processing engine 306 which is arranged to perform additional processing operations on slices of OFM data generated by the MCE 304, including, for example, pooling operations and applying activation functions. The post processing engine 306 can be programmed to perform different operations for different layers within a given neural network, allowing for a broad range of neural network architectures to be implemented. In this example, the post processing engine 306 is arranged to output the slices of processed OFM data to the memory 302 of the compute engine 212.1. The slices of processed OFM data may be stored in the memory 302 of the compute engine 212.1 if the memory 302 has sufficient capacity, may be transferred back to the memory 206 of the computing system 200, or may be broadcasted to the other compute engines 212 for further layer processing.

In an example, the computer system 200 is used to perform inference on an image in accordance with a neural network architecture including multiple convolutional layers. convolutional layer of the neural network includes multiple kernels and therefore implementing each convolutional layer involves multiple convolution operations. The image is retrieved from the memory 206, along with weight data corresponding to a kernel of a first convolutional layer of the neural network. Both the image and the kernel are transferred to the memory 302 of the compute engine 212.1. The compute engine 212.1 performs a convolution between the image and the kernel to generate a slice of processed OFM data, which is stored in the memory 302. Each of the compute engines 212 performs convolutions in this way between the image and one or more respective kernels of the first layer, resulting in each of the compute engines 212 storing multiple slices of processed OFM data. Once all of the kernels of the first layer have been applied, an entire processed OFM is stored between the compute engines 212. The processed OFM slices become IFM slices for the second convolutional layer of the neural network. The compute engines 212 are arranged to broadcast the stored IFM slices to one another such that each compute engine 212 can access the entire IFM for the second layer. Weight data corresponding to kernels of the second layer is then transferred from the memory 206 to the compute engines 212, and each of the compute engines 212 performs convolutions between the IFM one or more respective kernels of the second layer. This procedure is repeated for subsequent convolutional layers of the neural network. When the final convolutional layer has been implemented, the resulting processed OFM is transmitted to the memory 206 of the computing system 200 or the on-board memory of the NPU 208 (including the memory 302). A further layer of the neural network may follow the convolutional layers, for example a deconvolutional layer, a fully connected layer, or an output layer. Although in this example the layers of the neural network are processed one layer at a time, in other examples portions of multiple layers may be processed at the same time, resulting in so-called fused layer processing.

Figure 4:
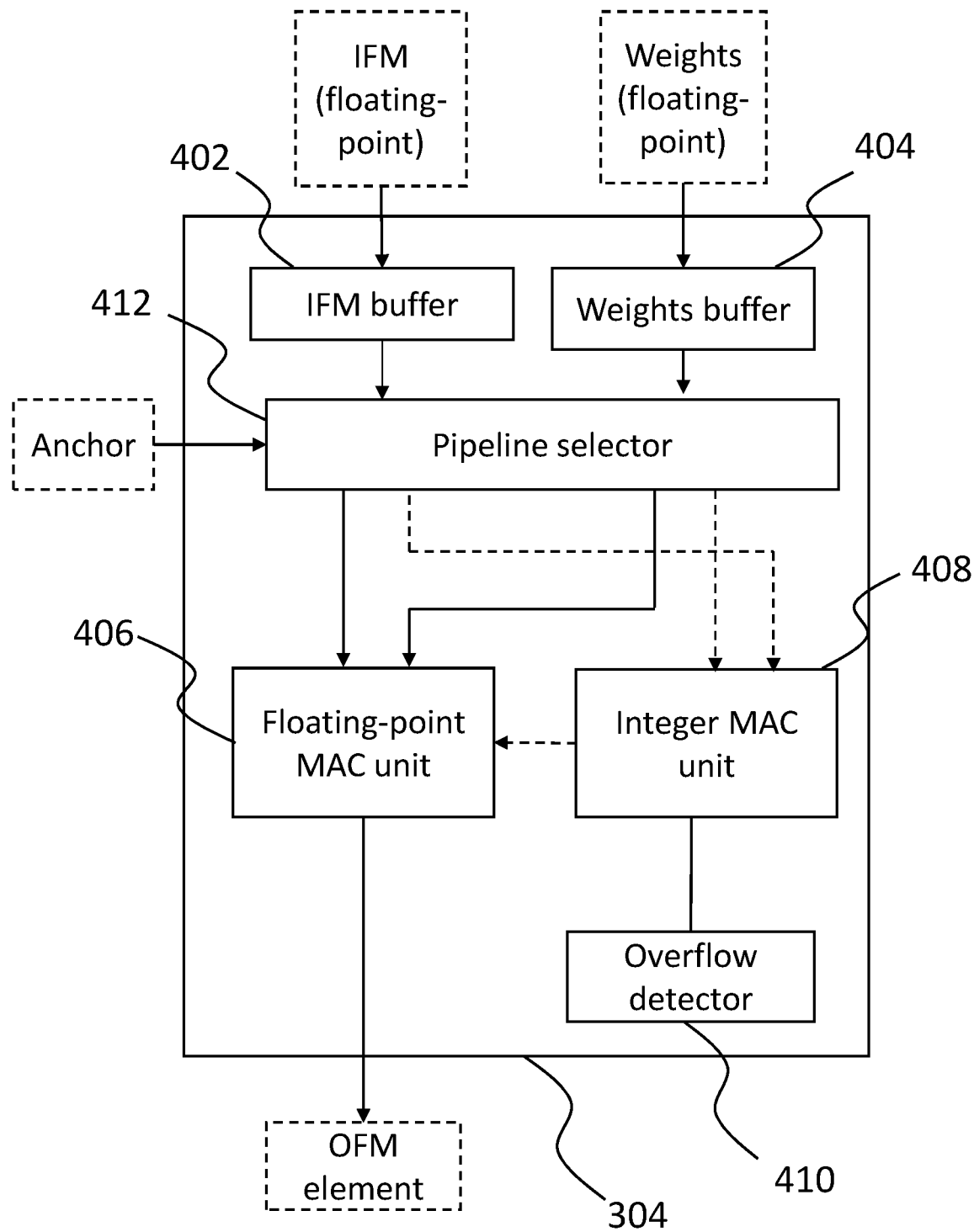
FIG. 4 shows schematically a multiply-accumulate (MAC) engine for performing MAC operations within the NPU of FIG. 3.

As shown in FIG. 4, the MCE 304 includes an IFM buffer 402 for temporarily storing IFM data (or other input data, such as image data) and a weights buffer 404 for temporarily storing weight values of a kernel. The MCE 304 further includes a floating-point MAC unit 406 for performing MAC operations on floating-point operands, and an integer MAC unit 408 for performing MAC operations on integer operands. The integer MAC unit 408 is connected to an overflow detector 412, which includes logical circuitry configured to determine whether an integer stored by the MAC unit 408 satisfies an overflow condition. The MCE 304 further includes a pipeline selector 412, which includes logical circuitry configured to determine whether a given MAC operation should be performed using the floating-point MAC unit 406 or the integer MAC unit 408. In the present example, the NPU 208 is operable to process data received in either a floating-point number format or in an integer format. Accordingly, the MCE 304 is arranged to operate in an integer mode in which the MCE 304 receives IFM data in an integer format, or in a floating-point mode in which the MCE 304 receives IFM data in a floating-point number format. When the MCE 304 operates in the integer mode, MAC operations are always performed using the integer MAC unit 408. When the MCE 304 operates in the floating-point mode, the pipeline selector 412 determines whether a given MAC operation should be performed by the floating-point MAC unit 406 or the integer MAC unit 408 in dependence on a given anchor value. In this case, the MCE 304 uses both the floating-point MAC unit 406 and the integer MAC unit 408 to generate an OFM element. In order for the integer MAC unit 408 to be used when the MCE 304 operates in the floating-point mode, floating-point data received by the MCE 304 must be converted into the anchored fixed-point number format, as will be explained in more detail hereafter.

In a floating-point number format, a number is represented by a single bit for the sign, multiple bits for the significand (also known as the mantissa, coefficient or argument), and multiple bits for the exponent. For example, the IEEE 754-2008 standard defines binary32 or single-precision floating point format as having 1 sign bit, 23 significand bits, and 8 exponent bits. Single-precision floating point is typically used in training machine learning models, for which a relatively high dynamic range is generally required for accurate computation of gradients during backpropagation. A further floating-point number format defined in the IEEE 754-2008 standard is binary16 or half-precision floating point format, which has 1 sign bit, 10 significand bits, and 5 exponent bits. Arithmetic operations performed using binary16 can be performed more quickly, and using less processing power, than arithmetic operations performed using binary32. However, binary16 has a significantly reduced numerical range compared with binary32. Another floating-point number format is Brain Floating Point (bfloat16), which has 1 sign bit, 7 significand bits, and 8 exponent bits. The bfloat16 format has been designed to maintain the numerical range of the binary32 format, but has a lower precision, allowing arithmetic operations to be performed more quickly than for binary32. This is particularly valuable for inference tasks where processing must be performed very quickly, such as for near real-time analysis of video or audio data. Due to bfloat16 having approximately the same numerical range as binary32, a machine learning model can be trained using the relatively high-precision binary32 format, then used to perform inference with the computationally less expensive bfloat16 format.

As an alternative to floating-point number format, numbers can be represented using a fixed-point number format. In a fixed-point number format, a number is effectively represented as an integer which is scaled by an implicit scale factor. In the present disclosure, an anchored fixed-point number (i, a) is defined by a two's complement integer portion i and an anchor value a. The anchor value is indicative of a value of a lowest significant bit of the number. For example, Table 1 shows an anchored fixed-point representation of several decimal values, using an 8-bit i and an anchor value a=−2.

| i | decimal value |
|---|---|
| 00000001 | 0.25 |
| 00010001 | 4.25 |
| 01111111 | 31.75 |
| 10000000 | −32 |

-continued

| i | decimal value |
|---|---|
| 10000011 | −31.25 |
| 11111111 | −1 |

When performing arithmetic operations using the anchored floating-point number format, the same anchor value is used for all operands. This allows the arithmetic operations to be performed using integer arithmetic.

Figure 5:
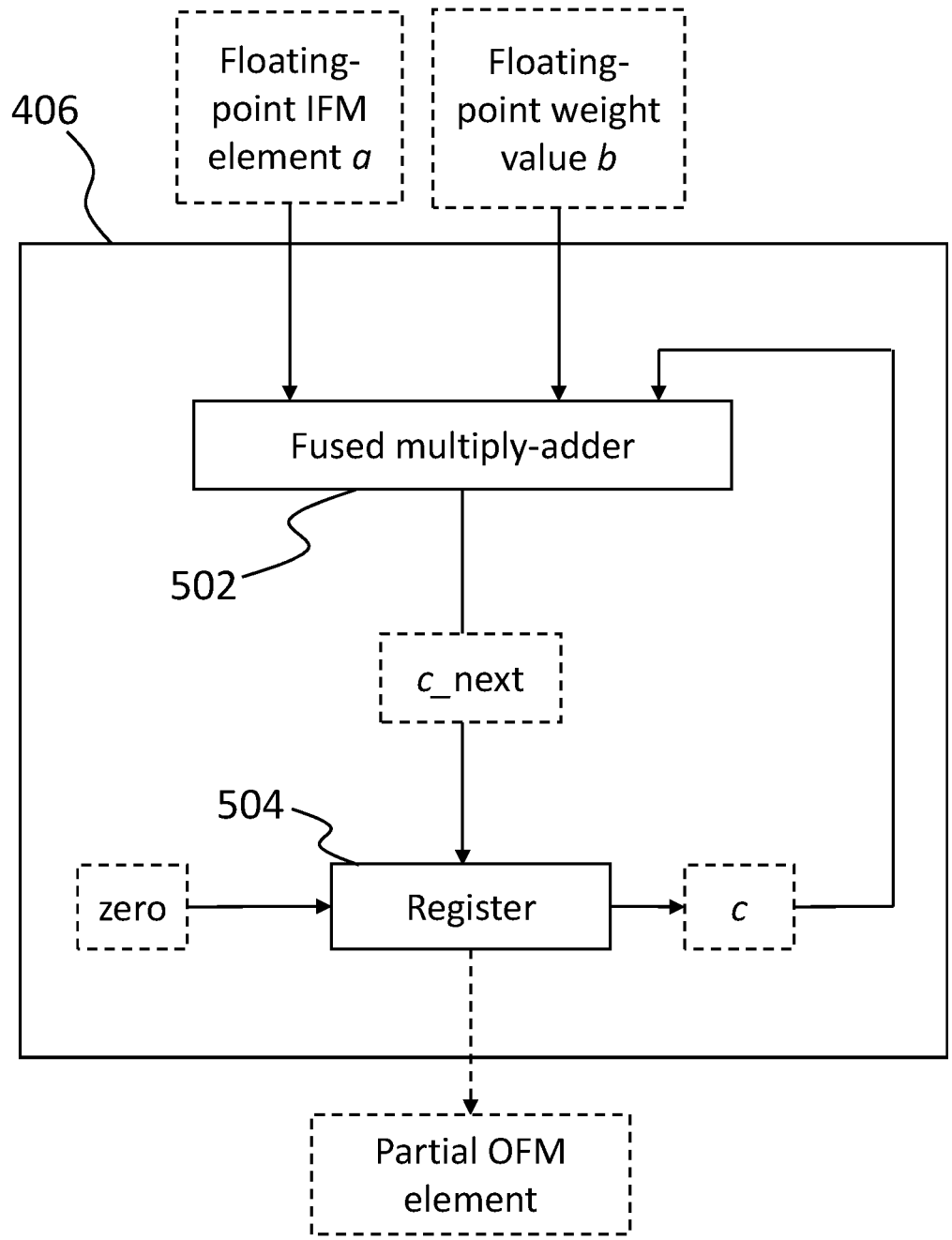
FIG. 5 shows schematically a floating-point MAC unit for performing MAC operations using floating-point arithmetic, within the MAC engine of FIG. 4.

As shown in FIG. 5, the floating-point MAC unit 406 in this example includes a fused multiply-adder 502 and a register 504. The register 504 in this example is used as a floating-point accumulator for storing numbers in a floating-point number format. During a sequence of MAC operations between weight value and data values, a current value c stored in the register 504 is initially set to zero. The fused multiply-adder 502 receives an data value a of the IFM and a weight value b in the floating-point number format, and reads the current value c stored in the register 504. The fused multiply-adder computes a quantity c_next=a*b+c and rounds the result once, maintaining the floating-point number format of the operands. This process is performed iteratively for a sequence of data values a and weight values b, with c_next replacing the current value of the operand c at each iteration. When the entire sequence of MAC operations has been performed in this way, the register 504 holds a partial or complete output element as will be explained in more detail hereafter.

It will be appreciated that the fused multiply-adder could alternatively be replaced with a separate floating-point multiplier and floating-point adder, in which case rounding would be performed twice; once after the determination of the product p=a*b and once after the determination of the sum p+c. Using a fused multiply-adder results in MAC operations being performed in fewer clock cycles compared with using a separate multiplier and adder, and results in slightly improved accuracy due to the reduced number of rounding operations. Those skilled in the art will be aware of various hardware implementations of the components of a floating-point MAC unit.

Figure 6:
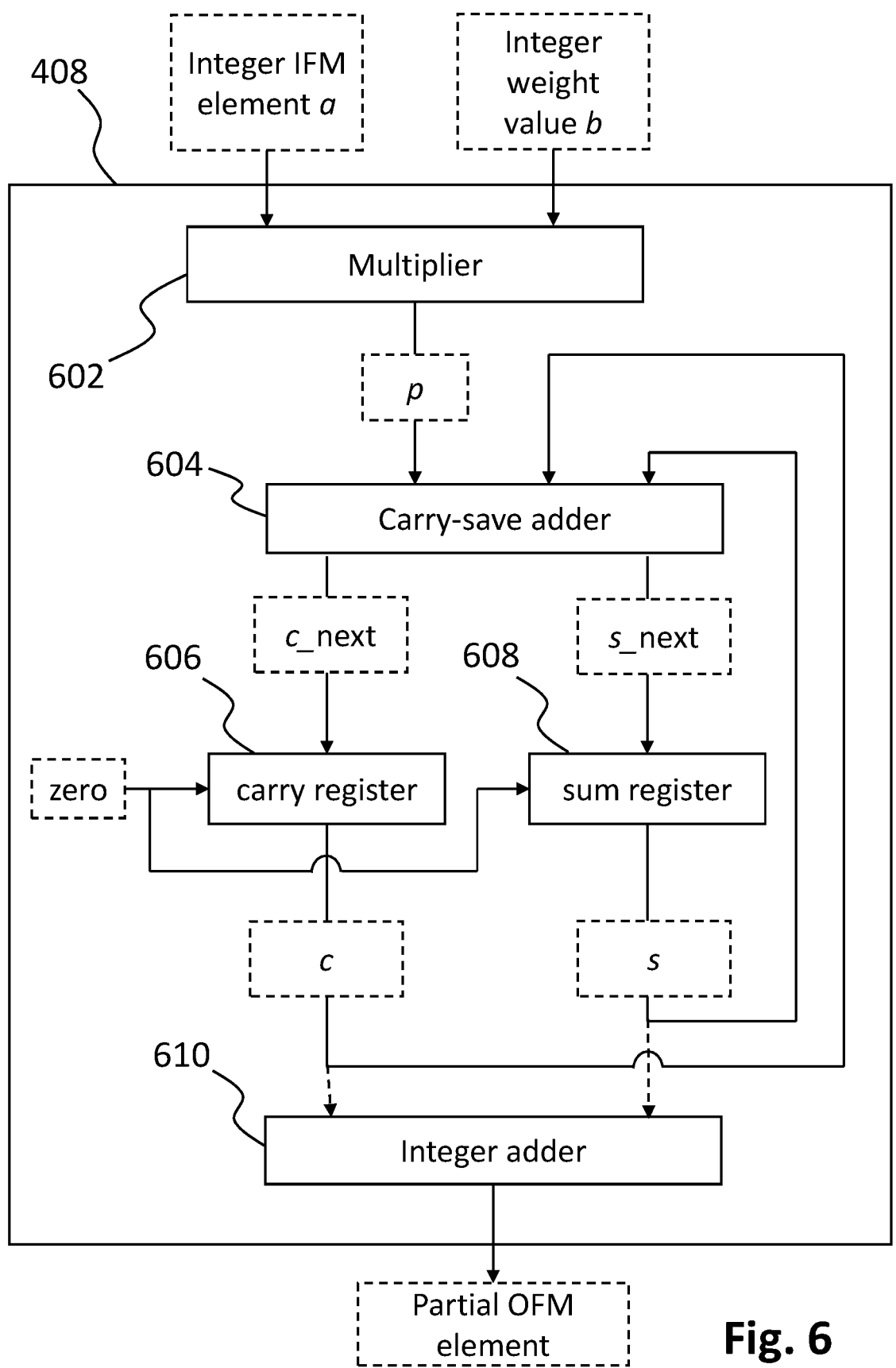
FIG. 6 shows schematically an integer MAC unit for performing MAC operations using integer arithmetic, within the MAC engine of FIG. 5.

As shown in FIG. 6, the fixed-point MAC 408 includes an integer hardware multiplier 602, a carry-save adder 604, a carry register 606, a sum register 608, and an integer adder 610. In this example, the integer adder is a ripple-carry adder, though in other examples other types of adder could be used, such as a carry-lookahead adder. The carry register 606 and the sum register 608 together are used as a fixed-point accumulator for storing fixed-point numbers in carry-save form, which is an example of a redundant binary representation, in which multiple registers are used to store respective intermediate integers from which a final integer value can be determined. It will be appreciated that other redundant binary representations of integers are possible. During a sequence of MAC operations between weight value and data values, a carry value c stored in the carry register 606 and a sum value s stored in the sum register 608 are both initially set to zero. The integer multiplier reads a data element a and a weight value b and computes a product p=a*b using integer arithmetic. In this example the product p is computed in the carry-save form, though in other examples the product p could be computed in a standard binary representation. The carry-save adder 604 adds the product p to the current values c and s stored in the registers 606 and 608 and stores the resulting sum p+c+s in carry-save form in the registers 606 and 608 as a pair of integers c_next, s_next.

The above process is performed iteratively for a series of a, b pairs, with the two integers c_next and s_next replacing the current carry and save values c and s at each iteration. When all of the necessary products of data values and weight values have been accumulated in carry-save form in the registers 606 and 608, the resulting integers c and s are added using the integer adder 610 to determine an output element. Using a carry-save adder eliminates the need to perform ripple carries before the end of the accumulation, reducing the amount of logic required and the resulting area. As a result, the gate delay resulting from the accumulation is significantly reduced compared with the gate delay of using other types of adder, such as a ripple-carry adder or a carry-lookahead adder. Furthermore, the number of bit switches (amount of toggling) is significantly reduced. The reduced toggling and logic result in reduced power use in performing the sequence of MAC operations. Other redundant binary representations of integers could similarly be used to reduce the gate delay and power use in performing an accumulation. It is noted that, whilst in this example the integer MAC unit 408 uses a redundant binary representation to store integer values during the accumulation, in other examples integer MAC operations may be performed using the standard binary representation. Even without using a redundant binary representation, integer arithmetic is faster and uses less power than floating-point arithmetic.

It is noted that whilst the MCE 304 in this example is shown as only having a single floating-point MAC unit 406 and a single integer MAC unit 408, in other examples an MCE can include multiple floating-point MAC units and multiple integer MAC units, and are accordingly able to generate multiple output elements, for example multiple OFM elements of an OFM slice, in parallel.

Figure 7:
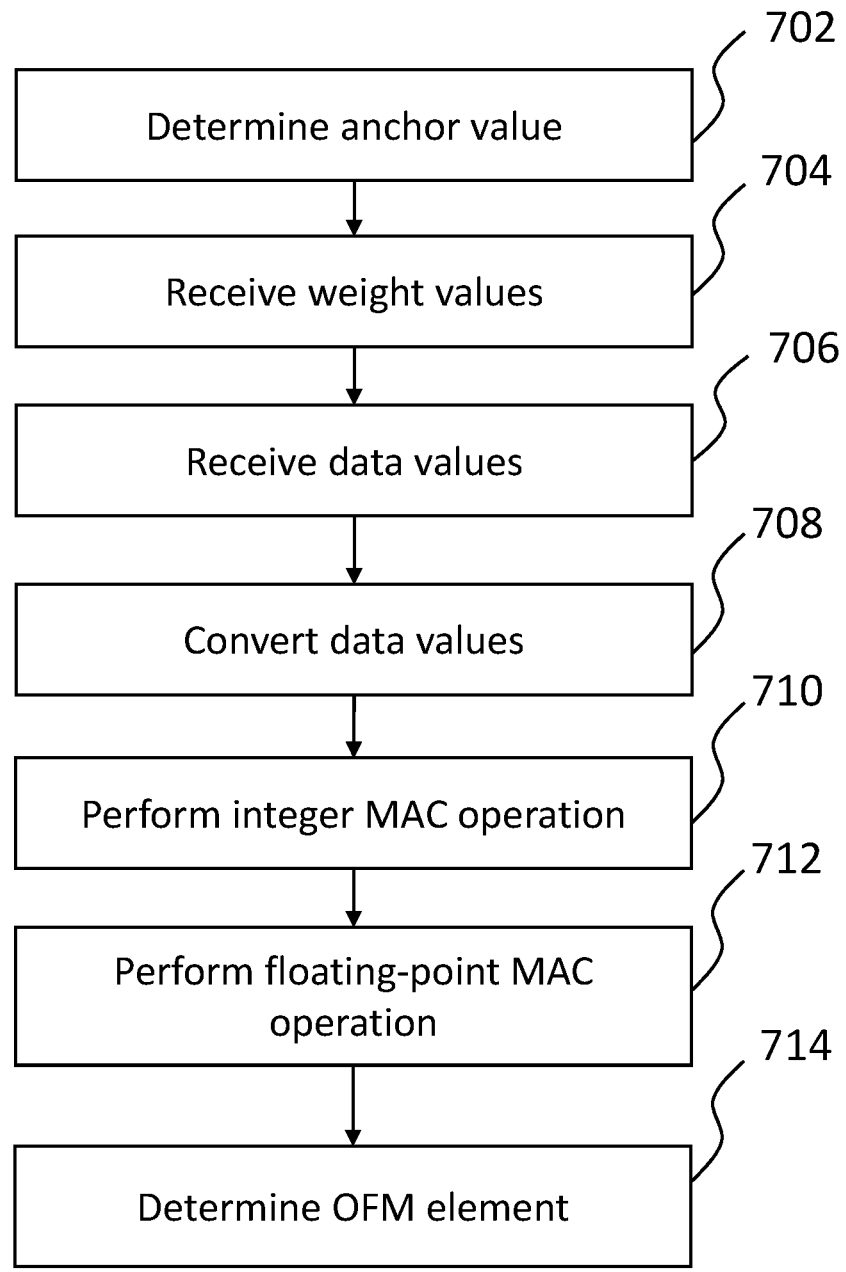
FIG. 7 is a flow diagram representing a method for performing a data processing operation in accordance with examples.
Figure 8A:
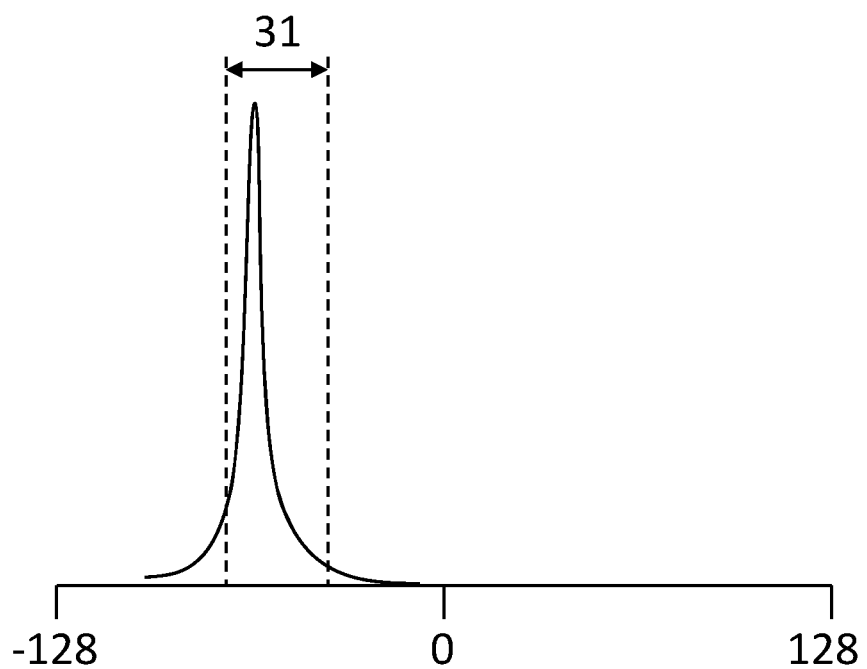
FIG. 8A shows schematically a distribution of magnitudes of data values in a data array.
Figure 8B:
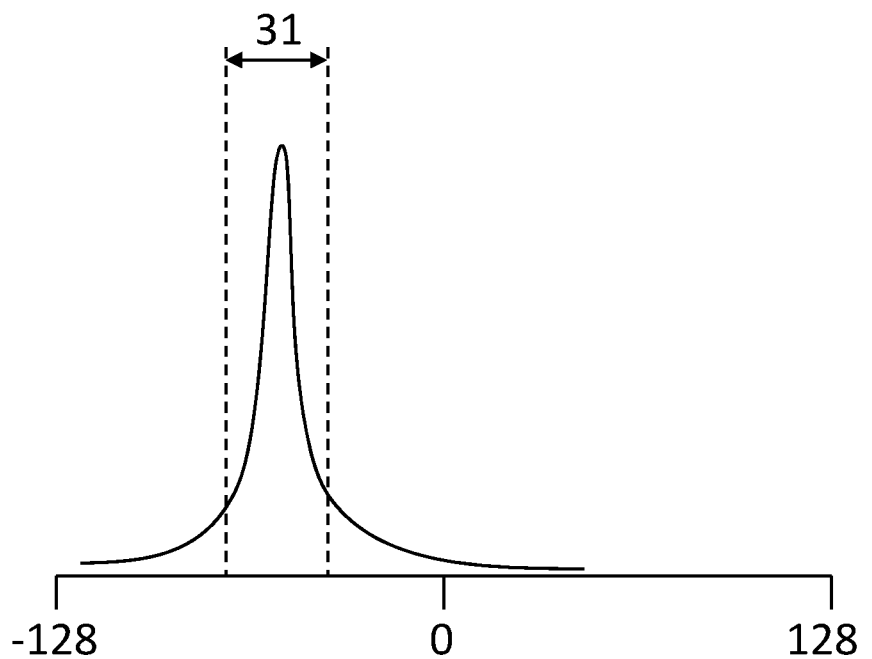
FIG. 8B shows schematically a distribution of magnitudes of products between the data values of FIG. 8A and respective weight values of a kernel.

FIG. 7 shows an example of a method performed by the NPU 208 of the computing system 200 to compute a dot product between a kernel and a subarray of an IFM, in order to generate an OFM element within a layer of a neural network. The NPU 208 determines, at 704, an anchor value indicative of a lowest significant bit of an anchored fixed point number format. It is observed that in most applications of neural networks, the distribution of data values in an IFM is skewed such that the majority of the data values are relatively small in magnitude (or zero), with a small minority of the data values being significantly larger in magnitude. Provided that the weight values are bounded, the majority of MAC operations in a convolution will therefore only use a small fraction of the dynamic range of the floating-point number format. FIG. 8A shows schematically a typical distribution of n data values $x_n$ of an IFM. The horizontal axis shows approximately the log range of magnitudes of numbers possible in either the bfloat16 or binary32 format. It is observed that the majority of data values lie within a narrow region shown between two vertical dashed lines. This region has a log range of 31, and therefore by choosing an appropriate anchor value, signed data values within this range can be represented in a 32-bit anchored fixed-point number format. FIG. 8B shows a distribution of terms $x_n*w_n$ resulting from taking the product of each input value $x_n$ of the IFM with a respective weight value $w_n$. It is observed that the distribution of FIG. 8B is slightly shifted and widened compared with the distribution of FIG. 8B, but due to the weight values being bounded (for example, as a result of normalization and/or quantization), the majority of the terms still lie within the region between two vertical dashed lines. It is therefore possible to perform the majority of the MAC operations between the data values and the respective weight values using 32-bit integer arithmetic. An even larger proportion of the MAC operations could be performed using 64-bit or higher integer arithmetic.

In the present example, the same anchor value is used for all MAC operations within a given layer of a neural network. The anchor value for a given layer is chosen to maximize the proportion of MAC operations which can be performed using integer arithmetic, without overflow or underflow. Data values or products which have a magnitude that is too large for the floating-point number format would result in overflow and in this example are processed using floating-point arithmetic. On the other hand, data values or products which have a magnitude that is too small to be represented using the anchored fixed-point number format result in underflow. Allowing a proportion of the smallest data values and products to underflow will likely have little effect on the overall accumulation result and therefore will likely be acceptable. The anchor value is chosen to minimize the proportion of data values and products resulting in overflow, whilst keeping the proportion of data values and products resulting in underflow at an acceptable level (in view of the required accuracy of the final accumulation result).

In this example, the anchor value for each layer is determined prior to the neural network processing, in dependence on the predicted magnitudes of IFM values arriving at that layer. The predicted magnitudes of IFM values for a given layer can be determined, for example, by running the neural network using floating-point arithmetic on a set of one or more test input data arrays and empirically determining the distribution of IFM values for each layer. In some examples, a diverse set of test input data arrays is chosen, so that anchor values can be determined which are suitable for almost any reasonable input data array of the neural network. In other examples, a set of test input data arrays is chosen to resemble the expected input data for a given application of the neural network. For example, a set of test input data arrays may include digital images of roads, vehicles and pedestrians, in a case where the neural network is to be used for a computer vision system in an autonomous vehicle.

In this example, the anchor value for each network layer is stored in the memory 206 of the computing system 200, and is retrieved by the DMA 214 at the beginning of the processing by that layer. In other examples, different anchor values are used for different kernels within a convolutional layer, in which case the anchor values may be chosen in dependence on the predicted magnitude of data values and also in dependence on the distribution of weight values in the kernel.

The NPU 208 receives, at 704, weight values of the kernel. In this example, the DMA 214 reads the weight values from the memory 206 in an integer format, under instructions from the control unit 210, and transfers the weight values of the kernel to the memory 302 of the compute engine 212.1. In other examples, weight values may be stored in a floating-point format.

The NPU 208 receives, at 706, data values of the IFM. In this example, the NPU 208 reads the data values from the memory 206 in floating-point number format and passes different subarrays of the IFM to the different compute engines 212. The compute engine 212.1 thereby receives one of the subarrays of the IFM and has the task of computing a dot product between that subarray and the kernel received at 702.

The MCE 304 converts, at 708, a first portion of the data values of the subarray received by the compute engine 212.1 from the floating-point number format to the anchored fixed-point number format. In this example, the pipeline selector 412 determines the first portion of the subarray for processing using fixed-point arithmetic, along with a remaining second portion of the subarray for processing using floating-point arithmetic. The MAC processing by the MCE 304 is thereby split into an integer pipeline and a floating-point pipeline. The first and second portions of the subarray are determined in dependence on the magnitudes of the data values of the subarray. In this example, the pipeline selector 412 reads the exponent of each input value of the subarray and compares the exponent with a threshold value. If the exponent does not exceed the threshold value, the pipeline selector 412 determines the input value to be part of the first portion for processing using fixed-point arithmetic. Otherwise, the pipeline selector 412 determines the input value to be part of the second portion for processing using floating-point arithmetic. The threshold value in this example is determined in dependence on the anchor value such that data values in the first portion of the subarray can be represented in the anchored fixed-point number format without overflowing, and any product between the input value and a weight values of the kernel can also be represented in the anchored fixed-point number format without overflowing. In the present example, the weight values of the kernel are defined as integers, so the limiting factor of whether an input value can be included in the first portion of the subarray is whether the product of the input value and one of the kernel values could overflow. The threshold value in this example is set low enough to avoid an overflow occurring after only a few integer MAC operations have been performed.

As explained above, in the present example the pipeline selector 412 determines the first and second portions of the subarray in dependence on the magnitudes of the data values. In other examples, the portions are determined in dependence on the magnitudes of the data values and the magnitudes of the weight values. For example, where the data values and the weight values are received in floating-point number format, separate checks can be performed on the exponents of the data values and the weight values to determine whether the input value would overflow and whether the product of the input value and the weight value would overflow. This method can result in a higher proportion of the data values being processed using the integer pipeline, but requires greater overheads in performing the pipeline selection. A further way of increasing the proportion of data values being processed using the integer pipeline is to use a wider integer pipeline including a MAC unit configured for a higher integer width (for example, 64-bit, 128-bit or more). Using a wider integer pipeline would, however, increase the processing cost of performing the integer MAC operations. Alternatively, multiple integer pipelines could be used with different anchor values to cover different portions of the dynamic range of the floating-point pipeline.

The pipeline selector 412 sends data values of the first and second portions of the subarray, along with respective weight values, to be processed by the integer MAC unit 406 and the floating-point MAC unit 408. As mentioned above, the data values sent to the integer MAC unit 406 are converted from the floating-point number format to the anchored fixed-point number format. Converting from the floating-point number format to the anchored fixed-point number format involves copying bits from the significand to appropriate integer bits, in dependence on the difference between the anchor value and the exponent of the floating point. On the other hand, weight values sent to the floating-point MAC unit 408 are converted from the integer format to floating-point format. Converting from the anchored fixed-point number format to the number format involves copying the integer bits to appropriate bits of the significand and setting the exponent bits.

The integer MAC unit 406 performs, at 710, integer MAC operations between data values of the first portion of the subarray and respective weight values of the kernel, to generate a first partial accumulation value, in the carry-save representation of the anchored fixed-point number format, in the carry register 606 and the sum register 608.

The floating-point MAC unit 408 performs, at 712, floating-point MAC operations between data values of the second portion of the subarray and respective weight values of the kernel to generate a second partial accumulation value in the floating-point number format in the register 504.

The MCE 304 determines, at 714, an OFM element in dependence on the generated accumulation values. In the present example, the MCE 304 is configured to generate the OFM element in the floating-point number format. Once the fixed-point MAC unit 406 has generated the first partial accumulation value, the fixed-point MAC unit 406 converts the first partial accumulation value from the carry-save representation to a standard binary representation of the anchored fixed-point number format using the integer adder 610, and then adds the resulting binary value to the second accumulation value. Adding the resulting binary value to the second accumulation value involves converting the binary value from the anchored fixed-point number format to the floating-point number format. Alternatively, the values stored in the carry register 606 and the save register 608 could be separately added to the second accumulation value.

In the example described above, it is assumed that the numbers being accumulated in the integer MAC unit 408 do not overflow during the generating of the first partial accumulation value. The pipeline selector 412 ensures that no individual input value, or product of an input value and kernel value, causes an overflow. However, because a large number of products may be accumulated in the carry register 606 and the save register 608, it is nevertheless possible for the accumulation value to overflow. Before this happens, the overflow detector 410 determines that an overflow condition is satisfied. In the present example, the overflow condition is satisfied when it is possible that a single further product could cause an overflow of the carry register 606 or the save register 608. In the present example, upon determining that the overflow condition is satisfied, the overflow detector 410 stops the integer MAC unit 408 and the floating-point MAC unit 406 from performing MAC operations. The accumulation value currently stored in the integer MAC unit 408 is converted to floating-point and combined with the accumulation value currently stored in the register 504 of the floating-point accumulator. The integer MAC unit 408 and the floating-point MAC unit 406 are then allowed to continue performing MAC operations until either the overflow condition is satisfied again or until every necessary MAC operation has been performed to determine the OFM element.

In some examples, a neural network is used to process a sequence of input data arrays, for example a sequence of image frames for computer vision applications or a sequence of audio frames for speech recognition applications. In this case, the anchor value used for a given network layer can be varied dynamically. An initial anchor value may be set to a default value, for example based on test input data arrays as described above. During the processing of the sequence of input data arrays, the control unit 210 of the NPU 208 monitors a frequency at which an overflow condition is satisfied for each layer of the network. If the frequency at which the overflow condition is satisfied is too high for a given layer, the NPU 208 may increase the anchor value for that layer for subsequent input data arrays. More generally, the NPU 208 may monitor the distribution of data values received within each layer, and dynamically vary the anchor value in dependence on the distribution. In some examples, if the anchor value for a given layer is determined to be too low within a given layer, resulting in a large number of overflows, the processing by that layer can be restarted with a new anchor value and/or a new anchor value can be used for the subsequent input data array in the sequence.

In the example method described above, a subarray of a data array is partitioned into two portions, one of which is processed using fixed-point arithmetic and the other of which is processed using floating-point arithmetic. In other examples, floating-point processing may be omitted altogether. This may be possible if the anchor value is chosen accurately and/or the integer pipeline is sufficiently wide to ensure no overflow occurs. In some examples, multiple fixed-point MAC units may be provided, each having its own associated anchor value. Different portions of a subarray may then be sent to the different fixed-point MAC units in dependence on the magnitudes of the data values. In another example, the entire subarray is always sent to the same fixed-point MAC unit or set of fixed-point MAC units, but the anchor value is varied dynamically. If an accumulator of the fixed-point MAC unit overflows, either a maximum value or another appropriate value is output, or the processing of the data array is stopped altogether. The anchor value may then be adjusted to reduce the chance of this happening for a subsequent data array. In the case of processing of a sequence of input data frames or arrays (for example in video or audio applications), it may be acceptable for the processing of a few input data arrays to fail or produce erroneous results, provided that accurate results are consistently produced for later frames. One or more initial frames of the sequence may therefore be run without outputting a result, solely to determine distributions of input values within each network layer and thereby to determine appropriate anchor values. By avoiding floating-point arithmetic, the layer processing is performed very rapidly, which may be valuable for applications such as computer vision or speech recognition. Furthermore, the amount of toggling and the resulting power used to perform the MAC operations is reduced. Many mobile systems have power budgets which must not be exceeded to avoid the mobile system from overheating. When applied in such systems, the present invention increases the amount of processing that can be performed without exceeding the power budget.

The above embodiments are to be understood as illustrative examples of the invention. Further embodiments of the invention are envisaged. In particular, the specific arrangement of hardware components described are only exemplary. Many other architectures are possible for an NPU, and the present invention is applicable to any such architecture. Although the examples described above pertained primarily to an implementation of a convolutional layer of a neural network, layer processing within other layers of a neural network, such as a deconvolutional layer, a fully-connected layer, or any other type of layer, also involves performing sequences of MAC operations between data values and weight values, and the present invention is therefore directly applicable in these situations. Furthermore, the present invention is applicable both during training and inference. More generally, the present invention can be applied in any setting where a sequence of MAC operations is performed.

It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What is claimed is:

1. A neural processing unit (NPU) for use within a host computing system, the NPU comprising:
    a fixed-point accumulator for storing numbers in an anchored fixed-point number format;
    a data interface arranged to retrieve, from memory of the host computing system, a plurality of weight values and a plurality of data values of a data array, wherein the data values are represented in a floating-point number format; and
    logic circuitry configured to:
        determine an anchor value indicative of a value of a lowest significant bit of the anchored fixed-point number format;
        convert at least a portion of the plurality of data values from the floating-point number format to the anchored fixed-point number format;
        perform multiply-accumulate (MAC) operations between the converted at least portion of the plurality of data values and respective weight values of the plurality of weight values, using fixed-point arithmetic, to generate an accumulation value in the fixed-point accumulator in the anchored fixed-point number format; and
        determine an output element of a layer of a neural network in dependence on the accumulation value,
    wherein the data interface is further arranged to write, to the memory of the computing system, the determined output value of the layer of the neural network.

2. The neural processing unit of claim 1, wherein the logic circuitry is further arranged to:
    determine, in dependence on magnitudes of the plurality of data values, the at least portion of the plurality of data values.

3. The neural processing unit of claim 2, wherein the determining of the at least portion of the plurality of data values comprises, for each data value of the plurality of data values:
    comparing an exponent associated with the data value and/or a respective weight value with a threshold value; and
    when the exponent does not exceed the threshold value, include the data value in the at least portion of the plurality of data values.

4. The neural processing unit of claim 3, wherein said threshold value is dependent on the anchor value.

5. The neural processing unit of claim 2, wherein:
    the at least portion of the plurality of data values is a first portion of the plurality of data values;
    the generated accumulation value is a first accumulation value;
    the system further comprises a floating-point accumulator for storing numbers in a floating-point number format; and
    the logic circuitry is further configured to:
        perform MAC operations between data values of a second portion of the plurality of data values and respective weight values of the plurality of weight values, using floating-point arithmetic, to generate a second accumulation value in the floating-point accumulator in the floating-point number format; and
        combine the first accumulation value and the second accumulation value.

6. The neural processing unit of claim 5, wherein combining the first accumulation value and the second accumulation value comprises:
    converting the first accumulation value from the anchored fixed-point number format to the floating-point number format; and
    summing the converted first accumulation value and the second accumulation value.

7. The neural processing unit of claim 1, wherein:
    each of the plurality of weight values is a weight value of a kernel;
    the determined output element is an element of a convolution between the data array and the kernel.

8. The neural processing unit of claim 1, wherein:
    the data array is a first data array; and
    determining the anchor value comprises:
        receiving, via the data interface, data values of a second data array; and
        determining the anchor value in dependence on magnitudes of the received data values of the second data array.

9. The neural processing unit of claim 8, wherein:
    said layer of the neural network is a first layer;
    the first data array is a first feature map generated by a second layer of the neural network preceding the first layer of the neural network, when the neural network is used to process a first input data array; and
    the second data array is a second feature map generated by the second layer of the neural network when the neural network is used to process a second input data array.

10. The neural processing unit of claim 9, wherein the second layer of the neural network is either a convolutional layer, a deconvolutional layer, or a fully-connected layer.

11. The neural processing unit of claim 9, wherein:
    the first input data array is a first image frame of a video; and
    the second input data array is a second image frame of the video, the second image frame chronologically preceding the first image frame within the video.

12. The neural processing unit of claim 1, wherein:
    the logic circuitry is further configured to:
        determine that the accumulation value satisfies an overflow condition; and
        convert the accumulation value from the anchored fixed-point number format to the floating-point number format in dependence on the determining that the accumulation satisfies the overflow condition.

13. The neural processing unit of claim 1, wherein the fixed-point accumulator is arranged to store numbers in a redundant binary representation of the anchored fixed-point number format.

14. The neural processing unit of claim 13, wherein the redundant binary representation of the anchored fixed-point number format is a carry-save representation.

15. A computer-implemented method performed by an NPU, the method comprising:

determining an anchor value indicative of a value of a lowest significant bit of an anchored fixed-point number format;

receiving, from memory of a host computing system, a plurality of weight values;

receiving, from the memory of the host computing system, a plurality of data values of a data array, wherein the data values are represented in a floating-point number format;

converting at least a portion of the plurality of data values from the floating-point number format to the anchored fixed-point number format;

performing MAC operations between the converted at least portion of the plurality of data values and respective weight values of the plurality of weight values, using fixed-point arithmetic, to generate an accumulation value in the anchored fixed-point number format;

determining an output element of a layer of a neural network in dependence on the accumulation value; and writing, to the memory of the host computing system, the determined output value of the layer of the neural network.

16. The method of claim 15, further comprising:
determining, in dependence on magnitudes of the plurality of data values, the at least portion of the plurality of data values.

17. The method of claim 16, wherein the determining of the at least portion of the plurality of data values comprises, for each data value of the plurality of data values:
comparing an exponent associated with the data value and/or a respective weight value with a threshold value; and
when the exponent does not exceed the threshold value, include the data value in the at least portion of the plurality of data values.

18. The method of claim 17, wherein said threshold value is dependent on the anchor value.

19. The method of claim 16, wherein:
the at least portion of the plurality of data values is a first portion of the plurality of data values; and
the generated accumulation value is a first accumulation value,
the method further comprising:
performing MAC operations between data values of a second portion of the plurality of weight values and respective weight values of the plurality of weight values, using floating-point arithmetic, to generate a second accumulation value in the floating-point number format; and
combining the first accumulation value and the second accumulation value.

20. A non-transient storage medium comprising machine-readable instructions which, when executed by an NPU, cause the NPU to perform operations comprising:
determining an anchor value indicative of a value of a lowest significant bit of an anchored fixed-point number format;

receiving, from memory of a host computing system, a plurality of weight values;

receiving, from the memory of the host computing system, a plurality of data values of a data array, wherein the data values are represented in a floating-point number format;

converting at least a portion of the plurality of data values from the floating-point number format to the anchored fixed-point number format;

performing MAC operations between the converted at least portion of the plurality of data values and respective weight values of the plurality of weight values, using fixed-point arithmetic, to generate an accumulation value in the anchored fixed-point number format;

determining an output element of a layer of a neural network in dependence on the accumulation value; and writing, to the memory of the host computing system, the determined output value of the layer of the neural network.

* * * * *